(12) United States Patent
Dake et al.

(10) Patent No.: US 12,176,899 B2
(45) Date of Patent: Dec. 24, 2024

(54) FLOATING HIGH-VOLTAGE LEVEL TRANSLATOR WITH ADAPTIVE BYPASS CIRCUIT

(71) Applicant: Texas Instruments Incorporated, Dallas, TX (US)

(72) Inventors: Tuli Luthuli Dake, Plano, TX (US); Satish Kumar Vemuri, Raleigh, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/507,502

(22) Filed: Nov. 13, 2023

(65) Prior Publication Data

US 2024/0080028 A1    Mar. 7, 2024

Related U.S. Application Data

(62) Division of application No. 17/828,797, filed on May 31, 2022, now Pat. No. 11,855,630.

(51) Int. Cl.
*H03K 19/0175* (2006.01)
*G01R 19/165* (2006.01)
(Continued)

(52) U.S. Cl.
CPC .......... *H03K 19/018528* (2013.01); *G01R 19/16566* (2013.01); *H03K 3/356113* (2013.01);
(Continued)

(58) Field of Classification Search
CPC ....... H03K 19/0175; H03K 19/017509; H03K 19/0185; H03K 19/018507;
(Continued)

(56) References Cited

U.S. PATENT DOCUMENTS 8,575,986 B2 * 11/2013 Sumitomo ..... H03K 19/018521
327/333
10,110,231 B1  10/2018 Graves
(Continued)

OTHER PUBLICATIONS

"bq5105xB High-Efficiency Qi v1.2-Compliant Wireless Power Receiver and Battery Charger," Texas Instruments, SLUSB42F—Jul. 2012—Revised Jun. 2017. 44 pages.
Liu, et al., "A New Circuit Topology for Floating High Voltage Level Shifters," IEEE, (2014). 4 pages.
(Continued)

*Primary Examiner* — Long Nguyen
(74) *Attorney, Agent, or Firm* — Ray A. King; Frank D. Cimino

(57) ABSTRACT

Techniques are described herein to enhance capability of floating level translators. For example, increased headroom is accomplished by adaptively bypassing the protection elements of the voltage level translator. In an example, a floating level translator can translate an input signal from a low-voltage domain to a high-voltage domain. A bypass circuit is coupled across the protection elements. The bypass circuit selectively engages during low-voltage operation (e.g., thereby providing a lower loss path relative to loss caused by the high-voltage protection elements and thus increasing the headroom swing), and disengages responsive to the high-voltage reference rail of the high-voltage domain exceeding a threshold or otherwise being high enough (e.g., greater than the potential of the low-voltage domain power rail). The bypass circuit can be implemented in a relatively low-complexity manner (e.g., back-to-back high-voltage FETs) without additional signals to control low-voltage capability.

7 Claims, 8 Drawing Sheets

(51) Int. Cl.
  *H03K 3/356* (2006.01)
  *H03K 5/22* (2006.01)
  *H03K 17/10* (2006.01)
  *H03K 19/003* (2006.01)
  *H03K 19/0185* (2006.01)

(52) U.S. Cl.
  CPC ............. *H03K 5/22* (2013.01); *H03K 17/102* (2013.01); *H03K 19/00361* (2013.01); *H03K 19/017509* (2013.01)

(58) Field of Classification Search
  CPC ... H03K 19/018514; H03K 19/018521; H03K 19/018528; H03K 19/003; H03K 19/00315; H03K 19/00346; H03K 19/00361; H03K 3/356113; H03K 17/102; H03K 5/22; H03K 5/24; H03K 5/2472; G01R 19/165; G01R 19/16566
  See application file for complete search history.

(56) References Cited

U.S. PATENT DOCUMENTS

| | | | |
|---|---|---|---|
| 10,122,359 | B2 | 11/2018 | Janssens |
| 10,256,820 | B2 * | 4/2019 | Duby .............. H03K 3/356182 |
| 10,418,997 | B2 | 9/2019 | Sakaguchi |
| 10,784,867 | B1 | 9/2020 | Kanteti et al. |
| 11,005,460 | B1 | 5/2021 | Abesingha |
| 11,855,630 | B2 * | 12/2023 | Dake .............. H03K 3/356182 |
| 2008/0042722 | A1 | 2/2008 | Dornbusch |
| 2012/0154014 | A1 | 6/2012 | Nakashima |
| 2018/0083612 | A1 | 3/2018 | Chan |

OTHER PUBLICATIONS

Liu, et al., "A New Design Technique for Sub-Nanosecond Delay and 200 V/ns Power Supply Slew-Tolerant Floating Voltage Level Shifters for GaN SMPS," IEEE Transactions on Circuits and Systems-I: Regular Papers, vol. 66, No. 3, Mar. 2019. pp. 1280-1290.

Liu, et al., "Design of On-Chip Gate Drivers With Power-Efficient High-Speed Level Shifting and Dynamic Timing Control for High-Voltage Synchronous Switching Power Converters," IEEE Journal of Solid-State Circuits, vol. 50, No. 6, Jun. 2015. pp. 1463-1477.

Moghe, "Nanosecond Delay Floating High Voltage Level Shifters in a 0.35 μm HV-CMOS Technology," IEEE Journal of Solid-State Circuits, vol. 46, No. 2, Feb. 2011. pp. 485-497.

Serneels, et al., "A High speed, Low Voltage to High Voltage Level Shifter in Standard 1.2V 0.13μm CMOS," IEEE, 2006. pp. 668-671.

Tang, Hao-Yen, "High Voltage Level-Shifter Circuit Design for Efficiently High Voltage Transducer Driving," Electrical Engineering and Computer Sciences, University of California, Berkeley, Technical Report No. UCB/EECS-2013-203. Dec. 1, 2014. 8 pages.

"UCC2720x, 120-V Boot, 3-A Peak, High Frequency, High-Side and Low-Side Driver," Texas Instruments, SLUS746C—Dec. 2006—Revised Apr. 2016. 41 pages.

"UCC2721x 120-V Boot, 4-A Peak, High-Frequency High-Side and Low-Side Driver," Texas Instruments, SLUSAT7F—Nov. 2011—Revised Dec. 2014. 42 pages.

Vaishnavi, et al., "Design and Analysis of Level Shifter in High Voltage Transmitter," International Journal of Scientific and Research Publications, vol. 4, issue 1, Jan. 2014. pp. 1-5.

Invitation To Pay Additional Fees; PCT/US2023/022905 with: Communication Relating To the Results of the Partial International Search; mail date Aug. 24, 2023.

* cited by examiner

FLOATING HIGH-VOLTAGE LEVEL TRANSLATOR WITH ADAPTIVE BYPASS CIRCUIT

CROSS-REFERENCE TO RELATED APPLICATIONS

This application is a division of U.S. patent application Ser. No. 17/828,797, filed May 31, 2022, which application is hereby incorporated herein by reference.

TECHNICAL FIELD

This description relates to voltage level translators, and more particularly, to floating high-voltage level translators.

BACKGROUND

A voltage level translator, also referred to as a voltage level shifter, is a circuit that translates a given signal from one voltage domain to another, which is useful for applications that utilize multiple voltage domains. The voltage domains between which translation is carried out can vary, but might include, for instance, first and second logic domains (e.g., such as the case where the level translator shifts a TTL signal to an ECL signal or a CMOS signal, or vice-versa, with TTL referring to transistor-to-transistor logic and ECL referring to emitter-coupled logic and CMOS referring to complementary metal oxide semiconductor), or low-voltage and high-voltage domains (e.g., such as the case where the level translator shifts a relatively low-voltage signal to a relatively high-voltage signal, or vice-versa).

A floating high-voltage level translator is used to shift the high and low levels of an input control signal received from a low-voltage circuit to the high and low levels of a high-voltage circuit that has floating power and reference (ground) rails. The potential difference between the floating power and reference rails can be relatively low (e.g., less than 5 volts, such as 2 or 3 volts), but the absolute respective values of the floating power rail and the floating reference rail can vary depending on the application and may be relatively high-voltage (e.g., 2 volts to 700 volts).

A number of level translator designs are available, each providing certain benefits that may be desirable for a given application, but a trade-off may exist between performance parameters such as propagation speed, common mode transient immunity (CMTI), and power dissipation. Accordingly, a number of non-trivial issues remain with level translators.

SUMMARY

Techniques are described herein to enhance low-voltage operation of floating high-voltage level translators.

One example is a voltage level translator circuit. The voltage level translator circuit includes a first field effect transistor (FET) and a second FET, each having a respective source coupled to a first (e.g., low-voltage) supply reference terminal, the gate of the first FET configured to receive an input signal, and the gate of the second FET configured to receive an inverted version of the input signal. The voltage level translator circuit further includes a third FET and a fourth FET, each having a respective gate coupled to a floating second (e.g., high-voltage) supply reference terminal, the drain of the third FET coupled to the drain of the first FET, the drain of the fourth FET coupled to the drain of the second FET, the source of the third FET coupled to a first output terminal, and the source of the fourth FET coupled to a second output terminal. The voltage level translator circuit further includes a fifth FET and a sixth FET, each having a respective source coupled to a floating (e.g., high-voltage) supply power terminal, the drain of the fifth FET coupled to the first output terminal, the drain of the sixth FET coupled to the second output terminal, the gate of the fifth FET coupled to the second output terminal, and the gate of the sixth FET coupled to the first output terminal. The voltage level translator circuit further includes a first bypass circuit coupled from the first output terminal to the gate of the third FET, and a second bypass circuit coupled from the second output terminal to the gate of the fourth FET.

Another example is an adaptive bypass circuit for a floating level translator. The floating level translator can translate voltage levels from a first voltage domain (e.g., low-voltage domain) to a second voltage domain (e.g., high-voltage domain). The adaptive bypass circuit includes a switching circuit and a comparator circuit. The switching circuit is coupled across a protection element of the floating level translator. The comparator circuit is configured to activate the switching circuit to bypass the protection element responsive to a reference rail of the second voltage domain being less than a threshold (e.g., thus indicating low-voltage operation), and to deactivate the switching circuit to not bypass the protection element responsive to the reference rail of the second voltage domain not being less than the threshold (e.g., thus not indicating low-voltage operation).

DETAILED DESCRIPTION

Techniques are described herein to enhance low-voltage capability of voltage level translators, by increasing headroom swing. The increased headroom is accomplished by adaptively bypassing high-voltage protection elements of the voltage level translator. In an example, a floating high-voltage level translator can translate an input signal from a low-voltage domain to a high-voltage domain. The level translator includes a bypass circuit coupled across the source-to-gate junction of the high-voltage protection elements. The bypass circuit selectively engages during low-voltage operation thereby bypassing the source-to-gate voltage of the high-voltage protection elements and thus increasing the headroom swing, and disengages responsive to the high-voltage reference rail of the high-voltage domain exceeding a threshold or otherwise being high enough (e.g., greater than the potential of the low-voltage domain power rail). The bypass circuit can be implemented in a relatively low-complexity manner (e.g., back-to-back high-voltage FETs) without additional signals to control low-voltage capability, and without compromise to propagation speed, quiescent current, or CMTI. The high-voltage protection elements can be optimally sized for propagation speed and are not required to be oversized to improve low-voltage performance, thus resulting in an area savings.

General Overview

Level shifters or translators are used in broad range of applications that may require a wide voltage range of operation (e.g., 2-700 volts). However, and as described above, there remain a number of non-trivial issues associated with level translators. For instance, high-voltage level translator applications tend to be limited in supply voltage range of operation at lower voltages and are not able to maintain correct state, propagation speed, and/or common mode transient immunity (CMTI) at low quiescent current. A root cause for such limitations is that, at lower voltages, a level translator may lose headroom. This loss in headroom effectively reduces the potential difference between high and low levels thus making the translator more susceptible to noise and error (e.g., noise can cause a high level to appear to be a low level, and vice-versa). To address such a headroom problem, different solutions have been proposed, but they tend to cause one or more additional problems.

Figure 3:
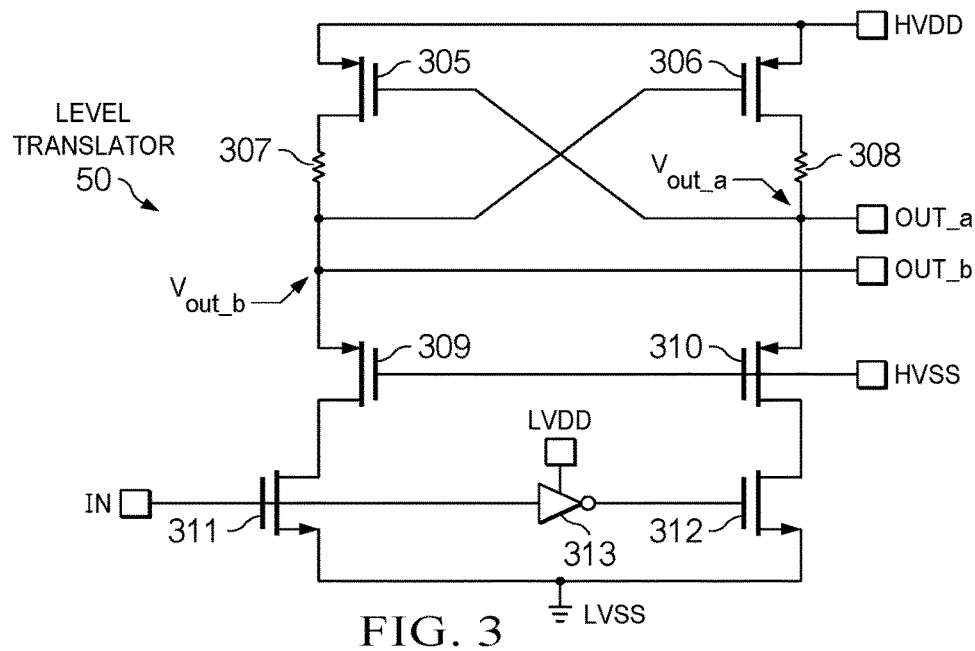
FIG. 3 is a schematic diagram of an example voltage level translator that is susceptible to a limited supply voltage range of operation at lower voltages.

In more detail, consider the example level translator 50 shown in FIG. 3. As shown, the level translator 50 includes cross-coupled low-voltage p-type field effect transistors (PFETs) 305 and 306, pull-up resistors 307 and 308, high-voltage PFETs 309 and 310, high-voltage n-type field effect transistors (NFETs) 311 and 312, and a low-voltage logic inverter 313. The sources of PFETs 305 and 306 are connected to a floating high-voltage power rail HVDD, and act as pull-up devices. The drains of PFETs 305 and 306 are connected to nodes $V_{out\_b}$ and $V_{out\_a}$, respectively, via respective pull-up resistors 307 and 308. Other examples may not include pull-up resistors 307 and 308, or a different pull-up element or circuit. The gate of PFET 305 is connected to node $V_{out\_a}$, and the gate of PFET 306 is connected to node $V_{out\_b}$. The PFETs 309 and 310 act as high-voltage protection elements. The source of PFET 309 is connected to node $V_{out\_b}$, and the source of PFET 310 is connected to node $V_{out\_a}$. The gates of PFETs 309 and 310 are connected to a floating high-voltage reference rail HVSS. The drain of PFET 309 is connected to the drain of NFET 311, and the drain of PFET 310 is connected to the drain of NFET 312. The sources of NFETs 311 and 312 are connected to a low-voltage reference rail LVSS, which is ground in this example. The gate of NFET 311 receives the input signal IN, and the gate of NFET 312 receives the inverted version of input signal IN, courtesy of inverter 313.

In operation, level translator 50 translates the high and low levels of input signal IN from the low-voltage domain (LVDD referenced to LVSS) to the high-voltage domain (HVDD referenced to HVSS). The input signal IN can be, for instance, a pulse width modulated (PWM) driver signal. In more detail, the PFETs 309 and 310 are always on, but their respective source-to-gate voltage (Vsg) changes depending on the state of NFETs 311 and 312. Specifically, for PFET 309, Vsg is about equal to the PFET 309 threshold voltage responsive to NFET 311 being on, or Vsg is about equal to HVDD-HVSS responsive to NFET 311 being off. Likewise, for PFET 310, Vsg is about equal to the PFET 310 threshold voltage responsive to NFET 312 being on, or Vsg is about equal to HVDD-HVSS responsive to NFET 312 being off. So, responsive to the input signal IN being high, NFET 311 turns on and thus connects node $V_{out\_b}$ to LVSS via PFET 309, which in turn causes PFET 306 to turn on thereby pulling up node $V_{out\_a}$ to HVDD. The high level of the input signal IN is thus translated from the low-voltage domain to the high level of the high-voltage domain, and is provided as OUT_a. Also, node $V_{out\_b}$ is clamped to the high-voltage reference level (HVSS) less the PFET 309 threshold voltage, and is provided at OUT_b. Also, responsive to the input signal IN being low, NFET 312 turns on and thus connects node $V_{out\_a}$ to LVSS via PFET 310, which in turn causes PFET 305 to turn on thereby pulling up node $V_{out\_b}$ to HVDD. Also, node $V_{out\_a}$ is clamped to HVSS less the PFET 310 threshold voltage, and is provided at OUT_a. The low level of the input signal IN is thus translated from the low-voltage domain to the low level of the high-voltage domain, and is provided as OUT_a. OUT_b is the complement to OUT_a.

The quiescent current of level translator 50 is zero or very low. This means that level translator 50 consumes no or little current when it is not level shifting a signal. Unfortunately, at low-voltage operation (e.g., such as the case when HVDD-LVSS is in the 2 or 3 volt range or otherwise below a given threshold indicative of low-voltage operation for a given application), the source-to-gate voltage of PFETs 309 and 310 limits the performance of the level translator 50. Accordingly, the headroom can be computed as (HVDD-LVSS) less the source-to-gate voltage of the corresponding PFET 309 or 310. A number of solutions are possible to address this headroom problem, but each causes another problem to arise.

In more detail, one such possible solution uses first and second diode-connected PFETs in parallel with respective ones of PFETs 305 or 306 to offer decent headroom swing, but at expense of quiescent current (increased power dissipation). Another possible related solution adds in a dynamic gate biasing scheme which helps reduce power dissipation to restore low quiescent current, but in turn causes an increase in propagation speed. Another possible solution employs a pulse-triggered level shifter topology that includes a pulse generator circuit as well as pull-up and pull-down current mirrors to cancel (or otherwise reduce) the injected common mode current, thus providing good low-voltage capability and CMTI, but at the expense of complexity and increased quiescent current. So, as described above, a trade-off (particularly at low-voltage operation) usually exists between headroom swing, propagation speed, CMTI, power dissipation (quiescent current), and complexity.

Thus, techniques are described herein to enhance low-voltage capability of floating high-voltage level translators, by increasing headroom swing with little or no significant impact to propagation speed, quiescent current, CMTI, or circuit complexity. In an example, a bypass circuit can be coupled across the source-to-gate junction of high-voltage protection elements (e.g., PFETs 309 and 310). The bypass circuit can adaptively engage (and disengage), and can be implemented without additional signals to control low-voltage capability. The bypass circuit can be controlled by an input PWM driver control signal, and adaptively engages during low-voltage operation, thereby bypassing the source-to-gate voltage of the high-voltage protection elements and thus increasing the headroom swing. Also, the bypass circuit adaptively disengages responsive to the high-voltage reference rail (e.g., HVSS) exceeding a threshold or otherwise being high enough. The bypass circuit can be implemented in a relatively low-complexity manner (e.g., back-to-back high-voltage FETs) and without compromise to propagation speed, quiescent current, or CMTI. The high-voltage protection elements (e.g., PFETs 309 and 310) can be optimally sized for propagation speed and are not required to be oversized to improve low-voltage performance, thus resulting in an area savings in addition to reduced complexity, a faster signal path, zero quiescent current impact, and enhanced CMTI performance at low-voltages without compromising CMTI performance at high-voltages, according to some such examples.

Circuit Architecture

Figure 1:
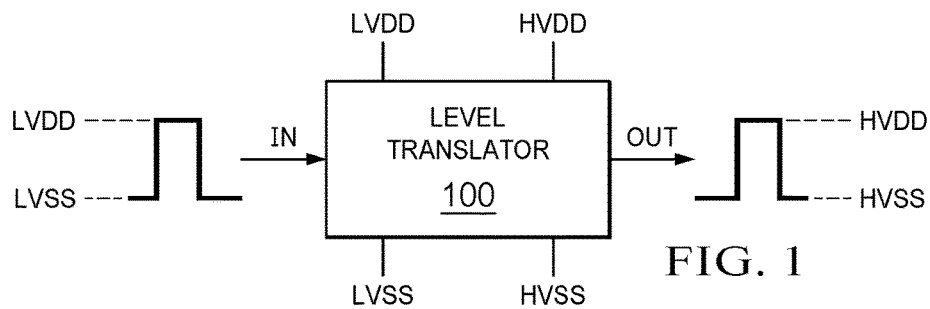
FIG. 1 illustrates a voltage level translator configured for enhanced low-voltage operation, in an example.

FIG. 1 illustrates a voltage level translator 100 configured for enhanced low-voltage operation, in an example. As shown, the level translator 100 is a floating high-voltage level translator that receives an input signal IN that corresponds to a first (low) voltage domain, and generates an output signal OUT that corresponds to a second (high) voltage domain. The first voltage domain includes a fixed low-voltage power rail LVDD and a fixed low-voltage reference rail LVSS, and the second voltage domain includes a floating high-voltage power rail HVDD and a floating high-voltage reference rail HVSS. The input signal IN is a PWM signal that generally transitions from LVSS to LVDD (or some lesser values, taking junction loss and any parasitics into consideration) and the output signal OUT is a PWM signal that generally transitions from HVSS to HVDD (or some lesser values, taking junction loss and any parasitics into consideration).

In operation, the voltage level translator 100 operates to shift the high and low levels of the low-voltage domain input signal IN to the high and low levels of the high-voltage domain output signal OUT. In an example, LVDD is a low-voltage supply referenced to ground (e.g., 2 volts or 3 volts). The potential difference between the floating high-voltage power and reference rails (HVDD-HVSS) can be relatively low (e.g., less than 5 volts, such as 2 or 3 volts), but the absolute respective values of HVDD and HVSS can vary depending on the application and may be relatively high-voltage (e.g., 2 volts to 700 volts).

In addition to referring to an actual power supply voltage or reference level, a "rail" as used herein may also refer to, for instance, a physical terminal of a power supply (a power terminal, or a return or reference terminal), or a circuit node adapted to be coupled to a terminal of a power supply. Thus, a rail as used herein may refer to a voltage supply power signal, a voltage supply reference signal, a voltage supply power node within a circuit, a voltage supply reference node within a circuit, a power terminal of a voltage supply, or a reference terminal of a voltage supply. The power supply may be, for instance, a fixed voltage supply having a fixed voltage output referenced to ground, or a floating voltage supply having a voltage output (further comprising both power and reference levels) that can vary (or float) within a given output range to meet the specific demands of a given application.

Figure 2:
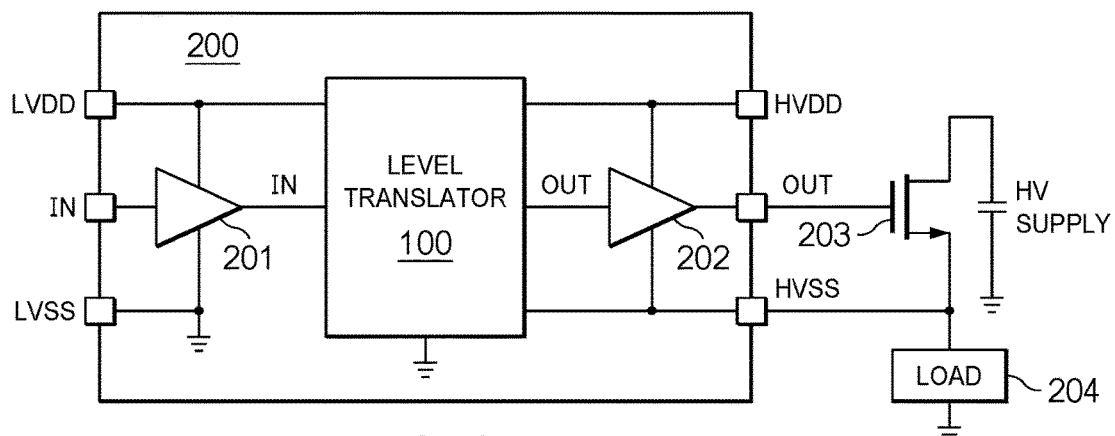
FIG. 2 illustrates a voltage level translator application, in an example.

FIG. 2 illustrates an application for voltage level translator 100, in an example. In this example, voltage level translator 100 is part of an integrated circuit 200 that includes input buffer 201 and output buffer 202. The input/output (I/O) pins or pads of the integrated circuit include IN, LVDD, LVSS, HVDD, HVSS, and OUT. As shown, the input buffer 201 is coupled to the power (LVDD) and ground (LVSS) rails of the low-voltage domain, and drives the input signal IN from the input of the integrated circuit to the input of voltage level translator 100. The output buffer 202 is coupled to the power (HVDD) and ground (HVSS) rails of the high-voltage domain, and drives the output signal OUT of voltage level translator 100 to the output of integrated circuit 200. Each of the input buffer 201 and the output buffer 202 can be implemented with standard buffer or driver circuitry. The integrated circuit 200 may include other circuitry and/or I/O pins or pads as well. As shown, the output signal OUT is being used to drive the gate of a high-voltage NFET 203, which in turn switches in a high-voltage supply to load 204. The NFET 203 can be implemented with any suitable switching technology. Likewise, the load 204 can be any load, such as a servo motor.

Figure 4:
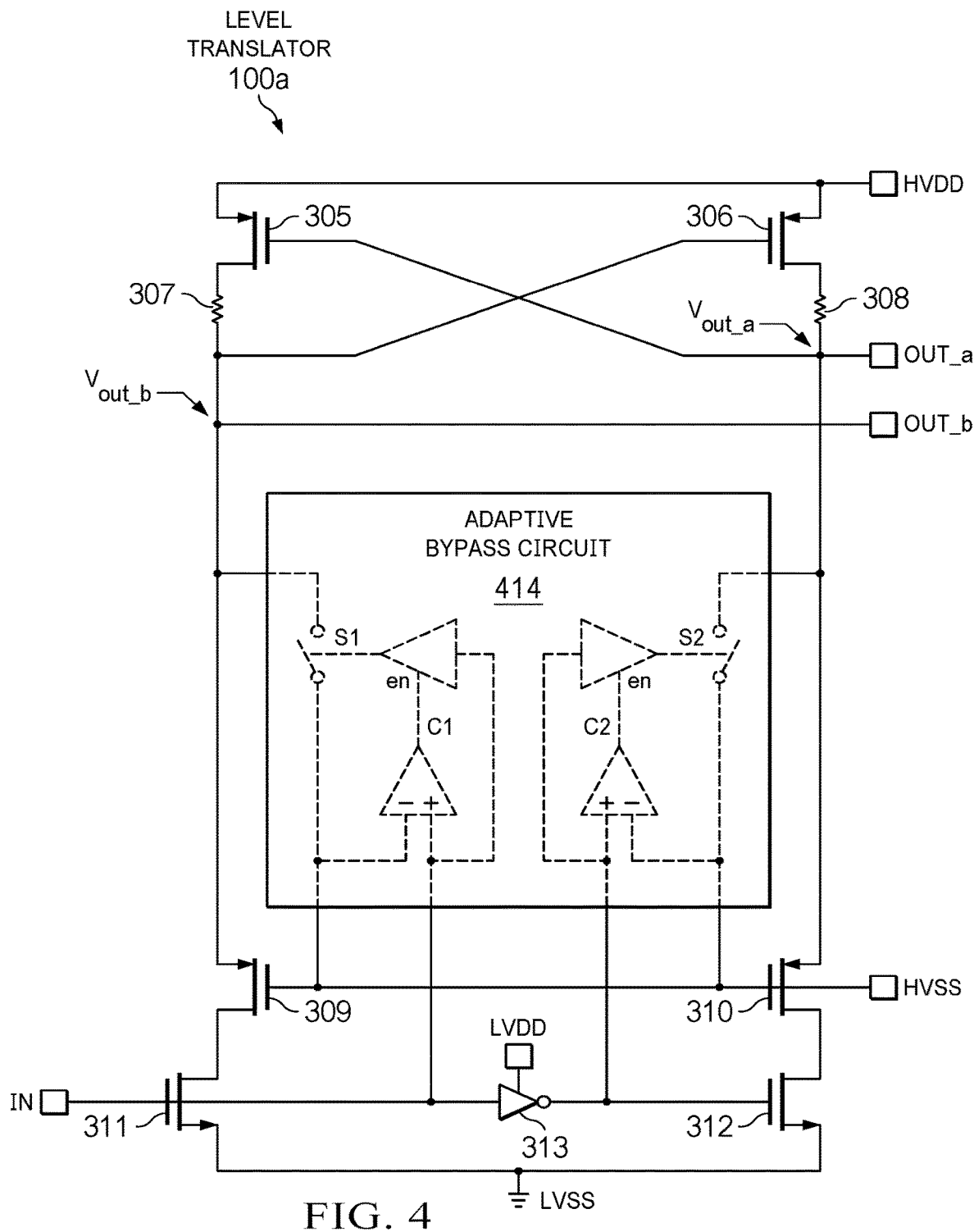
FIG. 4 is a schematic diagram of a voltage level translator configured to adaptively bypass high-voltage protection elements during low-voltage operation, in an example.

FIG. 4 is a schematic diagram of a voltage level translator 100*a* configured to adaptively bypass high-voltage protection elements during low-voltage operation, in an example. As shown, the voltage level translator 100*a* is similar to level translator 50, except that it further includes an adaptive bypass circuit 414 connected across the source-to-gate junctions of the high-voltage PFETs 309 and 310. The above relevant description with reference to FIG. 3 is equally applicable here, except that the headroom problem at low-voltage operation is mitigated by operation of adaptive bypass circuit 414, and without compromise to low quiescent current, state, propagation speed or CMTI, in some such examples.

During low-voltage operation, the adaptive bypass circuit 414 is configured to bypass or short-circuit the high-voltage protective elements (FETs 309 or 310). Such bypassing eliminates or otherwise reduces the loss in headroom attributable to the source-to-gate voltage of FETs 309 or 310. As shown, the adaptive bypass circuit 414 generally includes a comparator circuit or function (C1, C2) and a switching circuit or function (S1, S2) for each high-voltage protective element (309, 310). In more detail, comparator functions C1 and C2 effectively sense when the output voltage is high (HVDD>HVSS>LVDD) and disable switches S1 and S2, respectively, and irrespective of the input signal IN. In this case, the enable (en) input of the corresponding switching circuit is low (e.g., switch driver is disabled), so the switch remains open regardless of input signal IN. Also, comparator functions C1 and C2 sense low-voltage operation, such as when HVSS is less than LVDD (less any threshold voltage of comparator function), thus allowing switches S1 and S2 to be respectively controlled by the input signal IN. In this case, the enable (en) input of the switching circuit is high (e.g., switch driver is enabled), so the switch opens and closes responsive to the input signal IN. So, during sensed low-voltage operation, switch S1 is closed responsive to the input signal IN being high (logic 1), and switch S1 open responsive to the input signal IN being low (logic 0). Switch S2 is complimentary to switch S1, due to inverter 313. In this manner, the comparator functions C1 and C2 cause switches S1 and S2 to adaptively engage responsive to the input signal IN at low-voltage operation, and adaptively disengage responsive to HVSS being sufficiently high.

Figure 5:
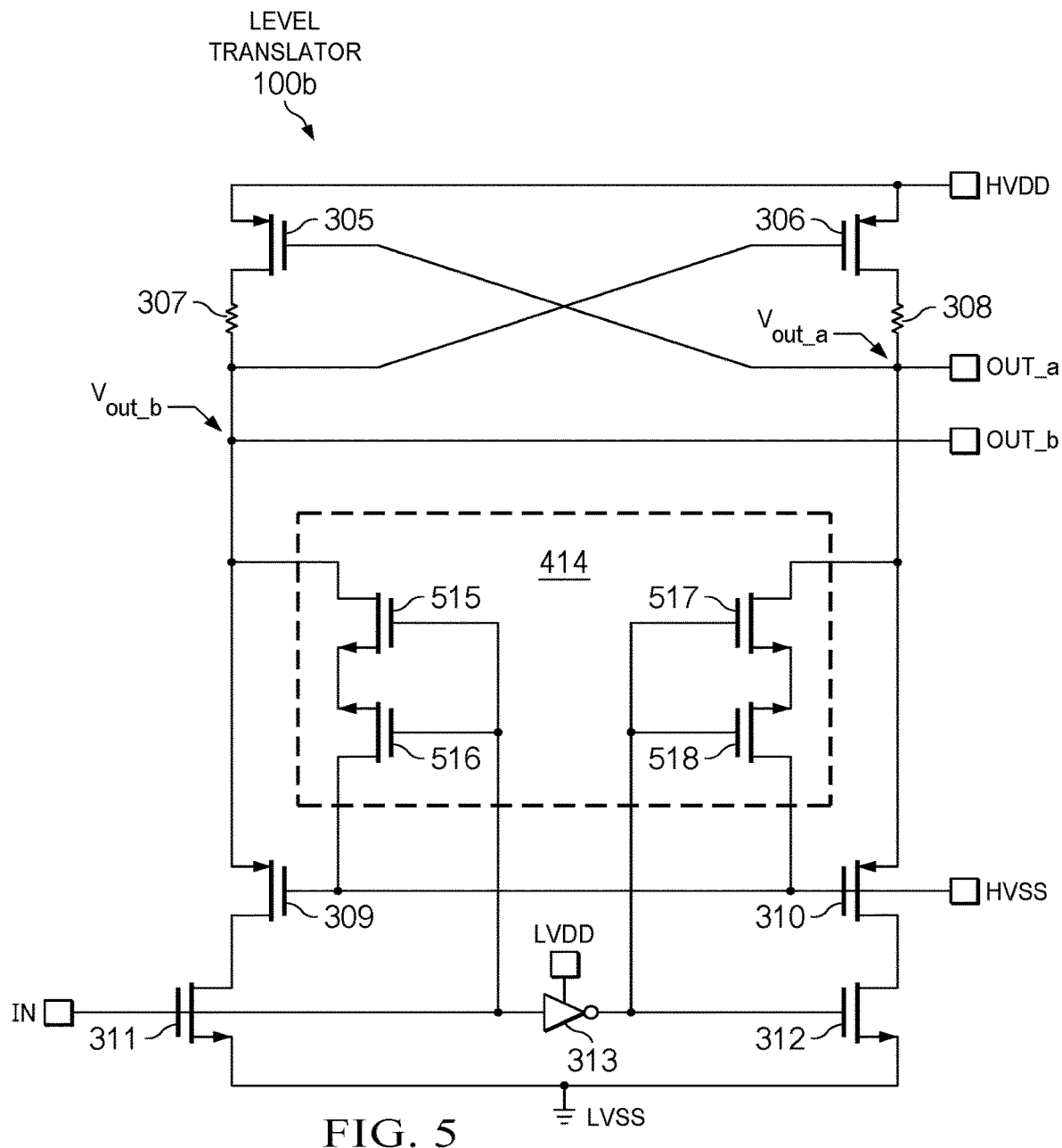
FIG. 5 is a schematic diagram of a voltage level translator configured to adaptively bypass high-voltage protection elements during low-voltage operation, in another example.

FIG. 5 is a schematic diagram of a voltage level translator 100b configured to adaptively bypass high-voltage protection elements during low-voltage operation, in another example. As shown, the voltage level translator 100b is similar to level translator 100a, except that adaptive bypass circuit 414 is implemented with a back-to-back NFET configuration that effectively provides the comparator and switching functions (C1, C2, S1, and S2) described above with respect to FIG. 4.

In more detail, a first pair of back-to-back NFETs (515 and 516) is connected across the source-to-gate junction of PFET 309, and a second pair of back-to-back NFETs (517 and 518) is connected across the source-to-gate junction of PFET 310. The gates and sources of NFETs 515 and 516 are connected together; similarly, the gates and sources of NFETs 517 and 518 are connected together. Also, the drain of NFET 515 connected to node $V_{out\_b}$, and the drain of NFET 516 is connected to the high-voltage reference rail HVSS; similarly, the drain of NFET 517 connected to node $V_{out\_a}$, and the drain of NFET 518 is connected to the high-voltage reference rail HVSS. The gates of NFETs 515 and 516 are driven by the input signal IN, and the gates of NFETs 517 and 518 are driven by the complement of input signal IN, courtesy of inverter 313.

In operation, at high-voltages, HVDD>HVSS>LVDD, the back-to-back NFETs 515 and 516 are naturally disabled/off irrespective of the input signal IN. As HVDD decreases to a point where HVSS is less than LVDD (less any threshold voltage of NFETs 515 and 516), the back-to-back NFETs 515 and 516 naturally turn on and are now controlled by the input signal IN. For example, NFETs 515 and 516 are enabled/on responsive to the input signal IN being high (logic 1) and disabled/off responsive to the input signal IN being low (logic 0). While on or otherwise enabled, the back-to-back NFETs 515 and 516 effectively short-circuit $V_{out\_b}$ to HVSS, thus bypassing the source-to-gate voltage of PFET 309 and consequently adding extra headroom for the cross-coupled PFET 305.

The back-to-back NFETs 517 and 518 are complimentary in polarity due to the inverter 313. So, at high-voltages, HVDD>HVSS>LVDD, the back-to-back NFETs 517 and 518 are naturally disabled/off irrespective of the input signal IN. As HVDD decreases to a point where HVSS is less than LVDD (less any threshold voltage of NFETs 517 and 518), the back-to-back NFETs 517 and 518 naturally turn on and are now controlled by the input signal IN. For example, NFETs 515 and 516 are enabled/on responsive to the input signal IN being low (logic 0) and disabled/off responsive to the input signal IN being high (logic 1). While on or otherwise enabled, the back-to-back NFETs 517 and 518 effectively short-circuit $V_{out\_a}$ to HVSS, thus bypassing the source-to-gate voltage of PFET 310 and consequently adding extra headroom for the cross-coupled PFET 306.

The improvement in headroom can be about equal to the source-to-gate voltage of the bypassed PFET 309 or 310, and can vary from one example to the next, depending on the CMOS process employed. In some examples, the source-to-gate voltage of the bypassed PFET 309 or 310 is in the range of about 0.7 to 1.0 volts. A specific example is described below with reference to FIG. 9, which shows how a voltage translator configured with a bypass circuit as variously described herein starts operating (level shifting) earlier in the high-voltage power rail ramp-up, relative to a voltage translator that is not so configured.

The values of the high-voltage and low-voltage power and reference rails, as well as various transistor parameters (e.g., threshold voltage, gate oxide rating, source-to-gate voltage) can vary from one example to the next, depending on the given application and CMOS process, but in one example case, the HVDD-HVSS differential supply is relatively low-voltage, such as a voltage that is below the maximum gate oxide rating of NFETs 515-518. In one such case, for instance, the HVDD-HVSS differential supply is in the range of about 2 or 3 volts. The absolute value of each of the HVDD and HVSS rails can float in a relatively large range, such as from 2 volts to 30 volts or higher, depending on the application. LVDD is low-voltage supply referenced to ground, such as in the range of about 1 to 2 volts. The input signal IN can be, for example, a PWM signal or other control signal that transitions between high and low states of a given low-voltage domain. In any such cases, the technique provided herein, whether by using back-to-back FETs (or other comparable comparator/switching function) controlled by the input signal IN creates an adaptive enhancement that automatically engages during low-voltage operation and automatically disengages after HVSS is sufficiently high (e.g., responsive to HVSS being greater than LVDD).

The comparator and switching functions are effectively integrated into the back-to-back FETs. For example, responsive to HVSS being higher than the voltage on node $V_{out\_b}$, the intrinsic diode of NFET 515 is forward biased, so FET 515 can conduct. In contrast, the intrinsic diode of NFET 516 is reverse biased and thus FET 516 can be turned off by applying a low level of the input signal IN to the gate of FET 516. Applying a high level of the input signal IN to the gate of FET 516 also applies that high level to the gate of FET 515, thus increasing channel conductivity of FET 515 relative to its conductivity achieved with just its intrinsic diode forward biased, and both FETs 515 and 516 turn on. The NFETs 515 and 516 reverse these roles if $V_{out\_b}$ is higher than HVSS. The NFETs 515 and 516 conduct (source-to-drain) responsive to LVDD being sufficiently greater than HVSS (sensing low-voltage operation), thus providing both a comparator-like function and a switching function. This description equally applies to back-to-back FETs 517 and 518.

Figure 6:
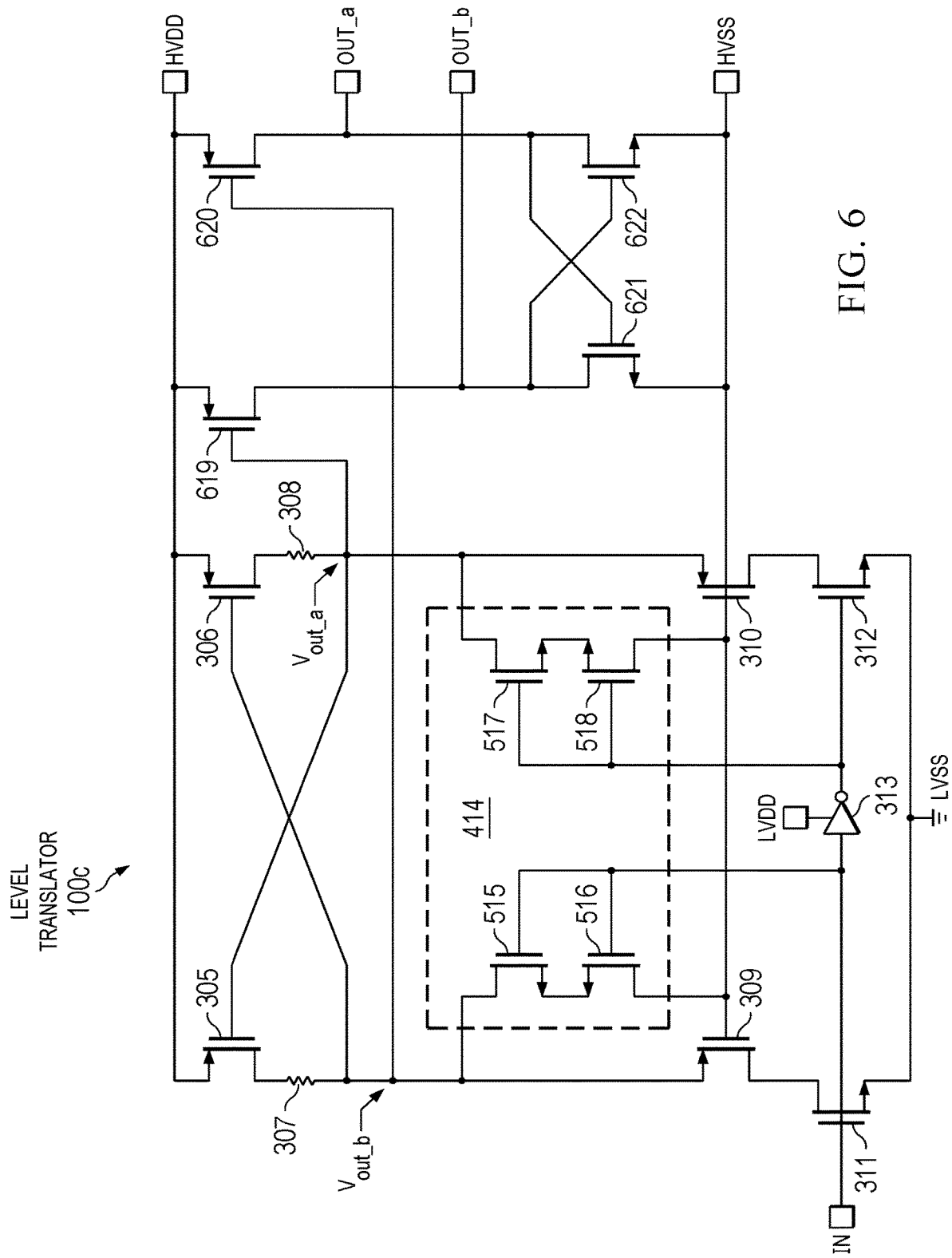
FIG. 6 is a schematic diagram of a voltage level translator configured to adaptively bypass high-voltage protection elements during low-voltage operation, in another example.

FIG. 6 is a schematic diagram of a voltage level translator 100c configured to adaptively bypass high-voltage protection elements during low-voltage operation, in another example. As shown, the voltage level translator 100c is similar to voltage level translator 100b, except that it further includes a differential output latch formed by PFETs 619 and 620 and cross-coupled NFETs 621 and 622. The sources a FETs 619 and 620 are connected to the high-voltage power rail HVDD. The gate of FET 619 is connected to node $V_{out\_a}$. The drain of FET 619 provides the output signal OUT_b, and is connected to the drain of FET 621 and the gate of FET 622. The gate of FET 620 is connected to node $V_{out\_b}$. The drain of FET 620 provides the output signal OUT_a, and is connected to the drain of FET 622 and the gate of FET 621. The sources of FETs 621 and 622 are connected to the high-voltage reference rail HVSS.

In operation, responsive to $V_{out\_a}$ being greater than $V_{out\_b}$, FET 619 creates less drain current than FET 620, which in turn causes FETs 621 and 622 to latch OUT_a to HVDD and OUT_b to HVSS. In contrast, responsive to $V_{out\_a}$ being less than $V_{out\_b}$, FET 619 creates more drain current than FET 620, which in turn causes FETs 621 and 622 to latch OUT_a to HVSS and OUT_b to HVDD.

Figure 7:
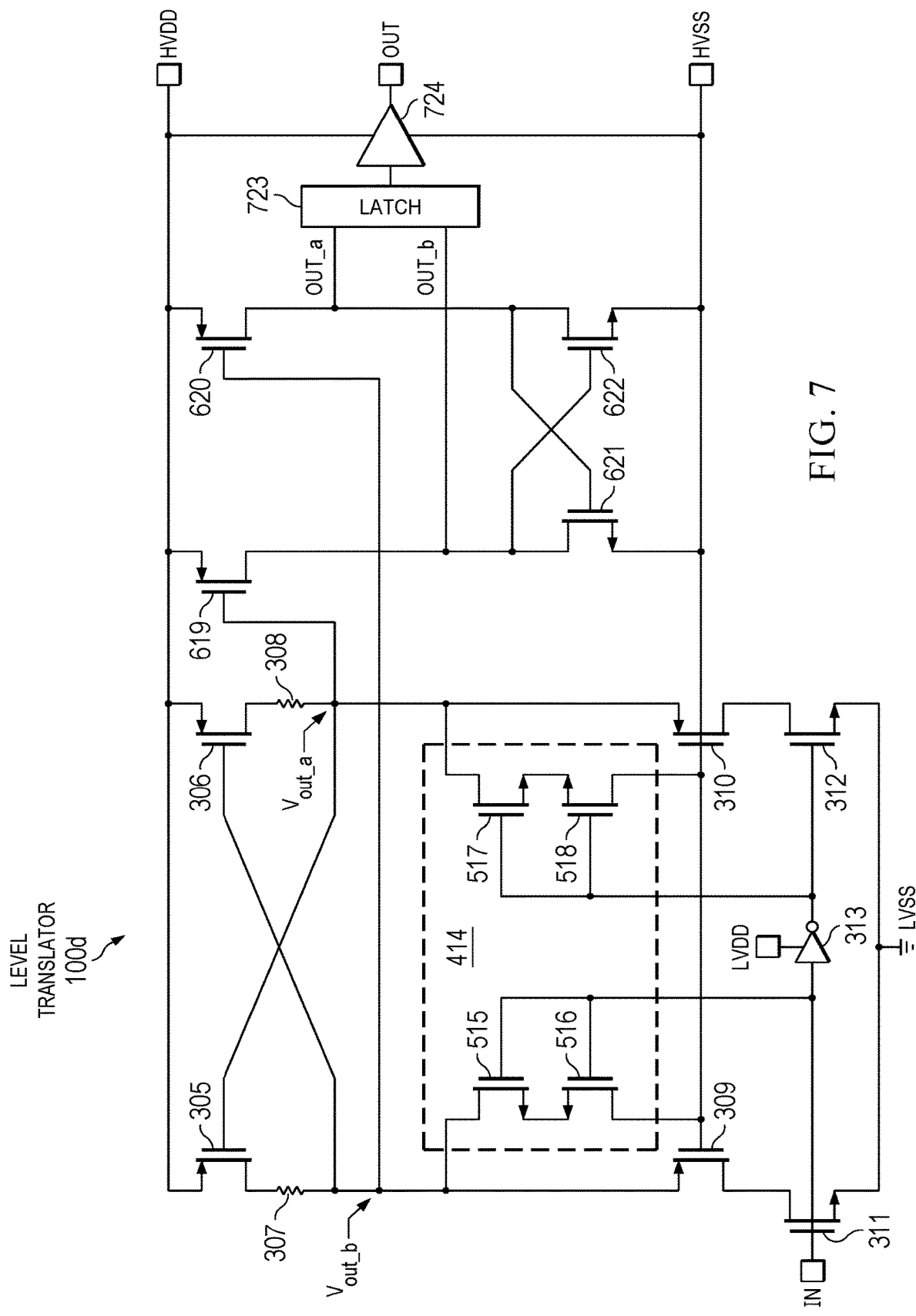
FIG. 7 is a schematic diagram of a voltage level translator configured to adaptively bypass high-voltage protection elements during low-voltage operation, in another example.

FIG. 7 is a schematic diagram of a voltage level translator 100d configured to adaptively bypass high-voltage protection elements during low-voltage operation, in another example. As shown, the voltage level translator 100*d* is similar to voltage level translator 100*c*, except that it further includes a latch 723 and driver or buffer 724. Latch 723 receives as input OUT_a and OUT_b, and latches OUT_a to the input of driver 724. Driver 724 provides the output signal OUT, which is the high-voltage version (or translated version) of the input signal IN. The output signal OUT can be, for example, a PWM signal. Latch 723 can be any number of latching circuits (e.g., NAND-based latch, NOR-based latch), and driver 724 can be any number of buffer/driver circuits (e.g., high-voltage driver, such as for driving the gate of a high-voltage FET).

Figure 8:
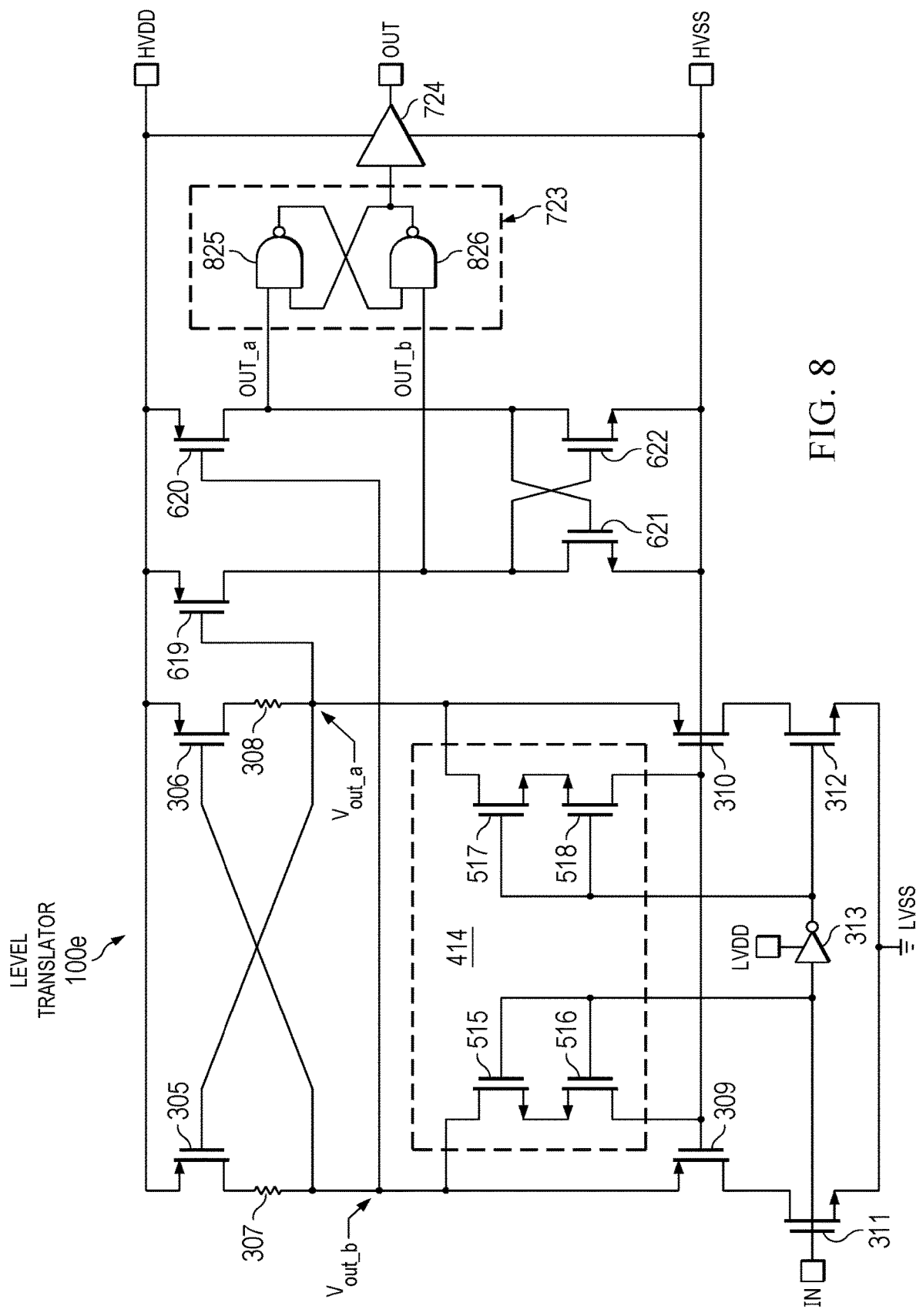
FIG. 8 is a schematic diagram of a voltage level translator configured to adaptively bypass high-voltage protection elements during low-voltage operation, in another example.

FIG. 8 is a schematic diagram of a voltage level translator 100*e* configured to adaptively bypass high-voltage protection elements during low-voltage operation, in another example. As shown, the voltage level translator 100*e* is similar to voltage level translator 100*d*, except that latch 723 is implemented with a NAND-based latch that includes NAND gates 825 and 826. In this example, if OUT_a is high and OUT_b is low, then gate 826 outputs a high level signal. In contrast, if OUT_a is low and OUT_b is high, then gate 826 outputs a low level signal. If NAND gates 825 and 826 were instead NOR gates arranged in the same fashion, then the opposite would apply. Specifically, if OUT_a is high and OUT_b is low, then gate 826 outputs a low level signal. In contrast, if OUT_a is low and OUT_b is high, then gate 826 outputs a high level signal.

Enhanced Low-Voltage Operation

Figure 9:
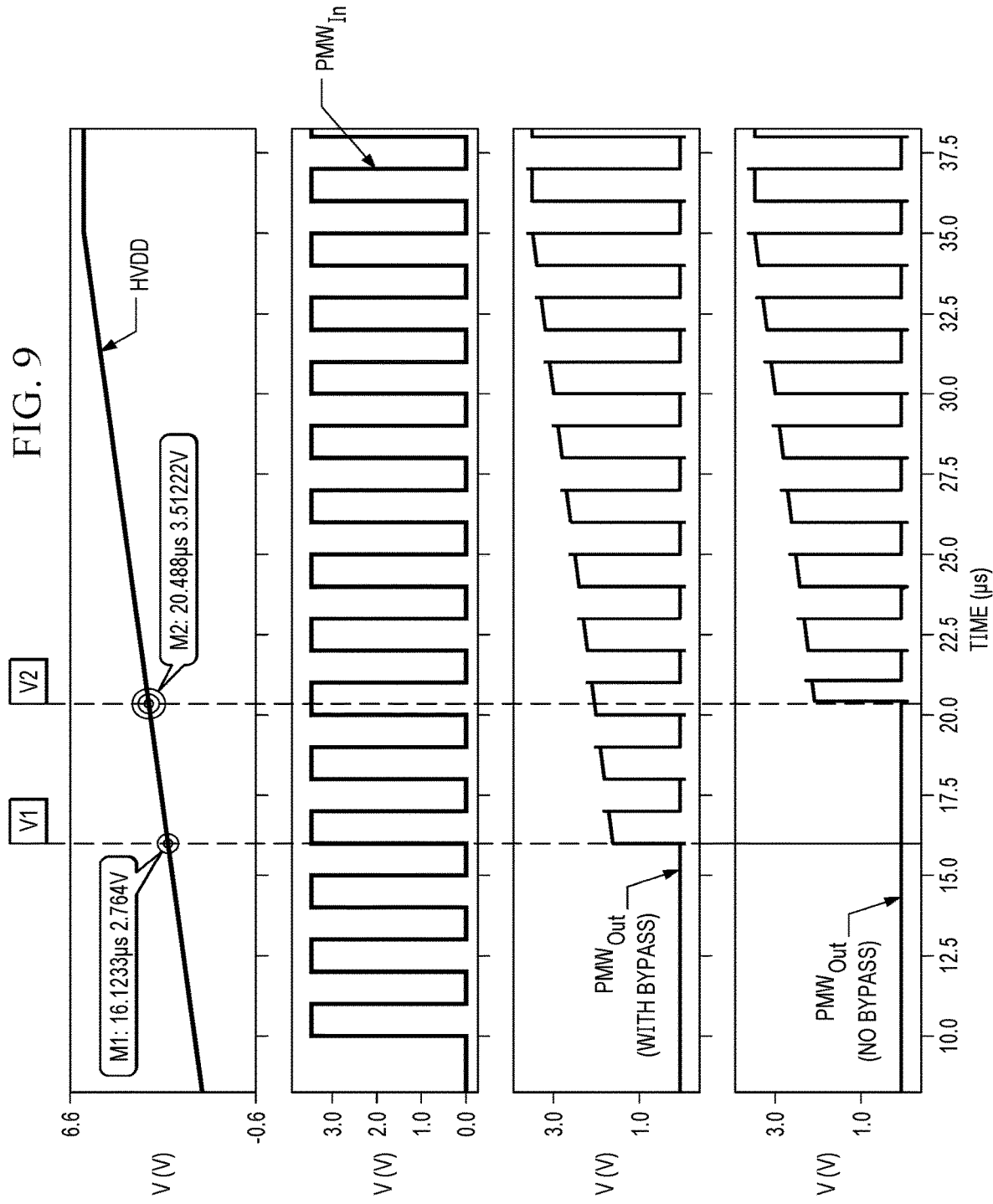
FIG. 9 shows various plots that demonstrate enhanced low-voltage operation of a voltage level translator configured to adaptively bypass high-voltage protection elements during low-voltage operation, in an example.

FIG. 9 shows various plots that demonstrate enhanced low-voltage operation of a voltage level translator configured to adaptively bypass high-voltage protection elements during low-voltage operation, in an example. As shown is this example case, the input signal IN is a PWM signal (PWM$_{In}$), as are both the output signals OUT (PWM$_{Out}$), further comprising one output that is generated by a level shifter that includes bypass circuit 414 and another output that is generated by a level shifter that does not include bypass circuit 414. In this example case, both PWM$_{In}$ and PWM$_{Out}$ toggle between about ground (0 volts) and about 3.6 volts. As shown, at low-voltage operation when HVDD-LVSS is relatively low (e.g., in the 3 volt range, or some other threshold suitable for a given application), the source-to-gate voltage of PMOS transistors 309 and 310 limits the performance of the level translator.

For example, the plots show about a 0.75 volt improvement in headroom when OUT follows PWM$_{In}$ as supply HVDD is ramped up. Specifically, with the adaptive bypass circuit 414 in place, the output voltage signal OUT of the voltage translator becomes active responsive to supply HVDD being around 2.764 volts. In contrast, without the adaptive bypass circuit 414 in place, the output voltage signal OUT doesn't become active until supply HVDD is around 3.512 volts. This 0.748 volt improvement in headroom is largely because adaptive bypass circuit 414 provides a parallel path that bypasses PMOS transistors 309, 310. In some example such cases, this parallel path provided by the bypass circuit 414 is a zero-loss (or otherwise low-loss) path, relative to the path through PMOS transistors 309, 310. In this manner, the improvement in headroom is equal to the source-to-gate voltage (Vsg) of transistor 309 or 310, which is about equal to the threshold voltage of transistor 309 or 310, respectively, according to one such example. Another example may have a headroom improvement about equal to Vsg of transistor 309 or 310, less any threshold voltage of the parallel path provided by the bypass circuit (e.g., FETs 515 and 516 or FETs 517 and 518).

Power Converter Application

Figure 10:
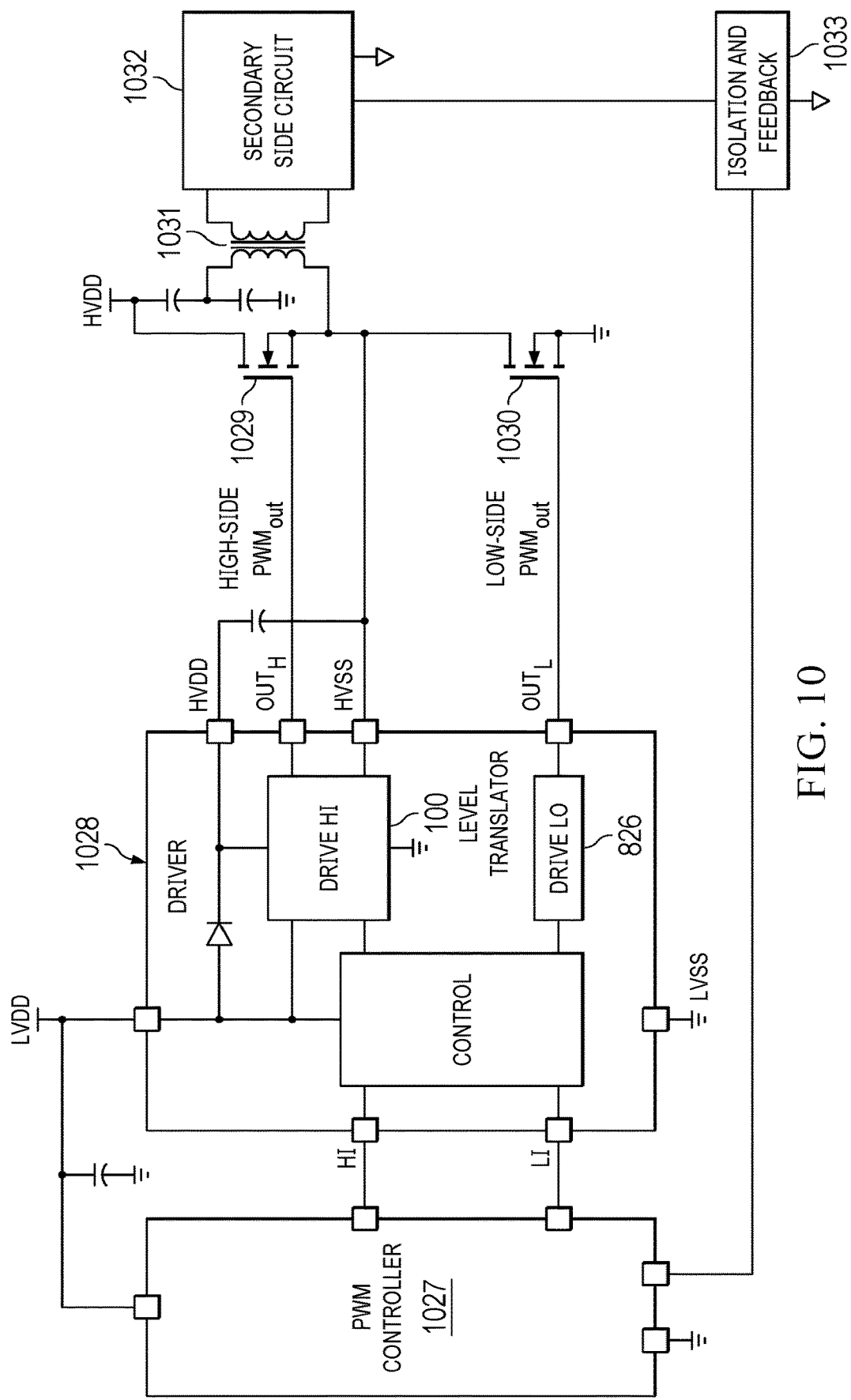
FIG. 10 illustrates a voltage level translator application, in another example.

FIG. 10 illustrates a voltage level translator application, in another example. As shown, this example application includes a high-side low-side driver 1028 coupled between a PWM controller 1027 and power PFETs 1029 and 1030 of an isolated switching power converter that further includes transformer 1031 and a secondary-side circuit 1032. Feedback signals from secondary-side circuit 1032 are provided to the PWM controller 1027 by way of isolation and feedback circuit 1033. Each of the PWM controller 1027, the high-side low-side driver 1028, the isolated switching power converter, and the secondary-side circuit 1032 can be implemented with standard or proprietary technology, except that the driver 1028 is configured with a level shifter 100, in an example.

In operation, the PWM controller 1027 generates high (HI) and low (LI) PWM control signals, responsive to the feedback signals from the secondary-side circuit 1032, by way of isolation and feedback circuit 1033. The driver 1028 receives each of the HI and LO PWM control signals and generates corresponding output drive signals OUT$_H$ and OUT$_L$, which in turn drive the gates of power FETs 1029 and 1030, respectively. The switching of FETs 1029 and 1030 allows the desired power level to be supplied to the secondary-side circuit 1032. The PWM controller 1027 is connected to a low-voltage domain that includes low-voltage power rail LVDD and reference rail LVSS, the switching power converter is connected to a high-voltage domain that includes floating high-voltage power rail HVDD and floating high-voltage reference rail HVSS, and the driver 1028 translates the PWM control signals from the low-voltage domain to the high-voltage domain. Filter capacitors may be connected between ground and each of the power rails, to attenuate high-frequency noise.

In an example, driver 1028 is implemented with a high-side low-side driver such as UCC27210 or UCC27211 by Texas Instruments Incorporated, except that the high-side drive circuit (DRIVE HI block) is implemented with a voltage level translator 100 configured with an adaptive bypass circuit (further comprising any one of voltage level translators 100*a-e*). More generally, any number of circuits having a need to interface one voltage domain with another voltage domain, whether in the context of high-side low-side power converter application or singular drive applications (e.g., high-side only applications or amplifier applications) or other floating high-voltage level translator application, may equally benefit from use of a voltage level translator configured with an adaptive bypass circuit as variously described herein. As shown, the PWM control signal HI is processed (e.g., buffered) through the Control block of driver 1028 and applied to the input of the Drive Hi block. As shown, the Drive Hi block generates the high-side PWM control output signal OUT$_H$, and is connected to the low-voltage power rail LVDD and low-voltage reference rail LVSS, as well as the floating high-voltage power rail HVDD and the floating high-voltage reference rail HVSS. In one such example, the low-voltage power rail LVDD is about 12 volts, the low-voltage reference rail LVSS is ground, the floating high-voltage power rail HVSS is in the range of −0.3 to 120 volts, the floating high-voltage reference rail HVSS is in the range of −1 to 115 volts, and the potential difference between HVSS and HVDD is about 12 volts. More generally, each of LVDD, LVSS, HVDD, and HVSS can be set as needed for a given application.

In any such cases, the PWM input signal to the Drive Hi block may correspond to the input signal IN of FIGS. 1-8; likewise, the output signal OUT$_H$ (high-side PWM$_{Out}$) from the Drive Hi block corresponds to the output signal OUT or OUT_a (or OUT_b, as the case may be) of FIGS. 1-8, and is used to drive the gate of power FET 1029. The above relevant description with respect to level translator 100 (further comprising any of 100a-e) is equally applicable here. Also, the DRIVE LO block of driver 1028 generates the output signal $OUT_L$ (low-side $PWM_{Out}$), which is used to drive the gate of power FET 1030.

Further Example Embodiments

Example 1 is a voltage level translator circuit. The voltage level translator circuit includes a first field effect transistor (FET) and a second FET, each having a respective source coupled to a first (e.g., low-voltage) supply reference terminal, the gate of the first FET configured to receive an input signal, and the gate of the second FET configured to receive an inverted version of the input signal. The voltage level translator circuit further includes a third FET and a fourth FET, each having a respective gate coupled to a floating second (e.g., high-voltage) supply reference terminal, the drain of the third FET coupled to the drain of the first FET, the drain of the fourth FET coupled to the drain of the second FET, the source of the third FET coupled to a first output terminal, and the source of the fourth FET coupled to a second output terminal. The voltage level translator circuit further includes a fifth FET and a sixth FET, each having a respective source coupled to a floating (e.g., high-voltage) supply power terminal, the drain of the fifth FET coupled to the first output terminal, the drain of the sixth FET coupled to the second output terminal, the gate of the fifth FET coupled to the second output terminal, and the gate of the sixth FET coupled to the first output terminal. The voltage level translator circuit further includes a first bypass circuit coupled from the first output terminal to the gate of the third FET, and a second bypass circuit coupled from the second output terminal to the gate of the fourth FET.

Example 2 includes the voltage level translator circuit of Example 1, wherein the floating supply power terminal is a first supply power terminal, and the voltage level translator circuit further includes an inverter configured to generate the inverted version of the input signal, the inverter coupled to a second (e.g., low-voltage) supply power terminal.

Example 3 includes the voltage level translator circuit of Example 1 or 2, wherein the drain of the fifth FET is coupled to the first output terminal by a first resistor, and the drain of the sixth FET is coupled to the second output terminal by a second resistor.

Example 4 includes the voltage level translator circuit of any one of Examples 1 through 3, wherein the input signal is a pulse width modulated signal.

Example 5 includes the voltage level translator circuit of any one of Examples 1 through 4, wherein the first and second FETs are each an n-type FET (NFET), and the third and fourth FETs are each a p-type FET (PFET). The first, second, third, and fourth FETs are high-voltage FETs, in some examples.

Example 6 includes the voltage level translator circuit of any one of Examples 1 through 5, further comprising a differential output latch circuit having a first input coupled to the first output terminal, a second input coupled to the second output terminal, a first latched output, and a second latched output.

Example 7 includes the voltage level translator circuit of Example 6, and further includes a logic latch circuit having a first input coupled to the first latch output of the differential output latch, a second input coupled to the second latch output of the differential output latch, and a third latched output.

Example 8 includes the voltage level translator circuit of Example 7, and further includes a buffer or driver circuit configured to receive the third latched output and provide an output signal.

Example 9 includes the voltage level translator circuit of any one of Examples 1 through 8, wherein: the first bypass circuit includes a seventh FET and an eighth FET, the drain of the seventh FET coupled to the first output terminal, the source of the seventh FET coupled to the source of the eighth FET, the drain of the eighth FET coupled to the gate of the third FET, and the gates of the seventh and eighth FETs configured to receive the input signal; and the second bypass circuit includes a ninth FET and an tenth FET, the drain of the ninth FET coupled to the second output terminal, the source of the ninth FET coupled to the source of the tenth FET, the drain of the tenth FET coupled to the gate of the fourth FET, and the gates of the ninth and tenth FETs configured to receive the inverted version of the input signal.

Example 10 includes the voltage level translator circuit of Example 9, wherein each of the seventh, eighth, ninth, and tenth FETs is an n-type FET (NMOS) FET. The seventh, eighth, ninth, and tenth FETs are high-voltage FETs, in some examples.

Example 11 is an integrated circuit comprising the voltage level translator circuit of any one of Examples 1 through 10.

Example 12 includes the integrated circuit of Example 11, the integrated circuit further comprising a power converter driver that includes the voltage level translator circuit.

Example 13 includes the integrated circuit of Example 12, the power converter driver being a high-side low-side driver, and the voltage level translator circuit is part of a high-side driver circuit of the high-side low-side driver. In one particular example, the integrated circuit comprises a high-side low-side driver that includes the voltage level translator circuit of any one of Examples 1 through 10, the voltage level translator circuit being part of a high-side driver circuit of the high-side low-side driver.

Example 14 is a system further comprising the integrated circuit of any one of Examples 11 through 13.

Example 15 includes the system of Example 14, the system being a power converter.

Example 16 includes the system of Example 14, the system being a power supply.

Example 17 includes the system of Example 14, the system being an amplifier.

Example 18 is an adaptive bypass circuit for a floating level translator. The circuit can translate voltage levels from a first voltage domain (e.g., low-voltage domain) to a second voltage domain (e.g., high-voltage domain). The adaptive bypass circuit includes a switching circuit and a comparator circuit. The switching circuit is coupled across a protection element (e.g., high-voltage protection element) of the floating level translator. The comparator circuit is configured to activate the switching circuit to bypass the protection element responsive to a reference rail of the second voltage domain being less than a threshold (e.g., such as the case where HVSS is less than LVDD, thus indicating low-voltage operation), and to deactivate the switching circuit to not bypass the protection element responsive to the reference rail of the second voltage domain not being less than the threshold (e.g., such as the case where HVSS is not less than LVDD, thus not indicating low-voltage operation).

Example 19 includes the adaptive bypass circuit of Example 18, wherein the switching circuit and the comparator circuit are implemented with a pair of field effect transistors (FETs) arranged in back-to-back configuration.

Example 20 includes the adaptive bypass circuit of Example 19, wherein the pair of FETs includes a first n-type FET (NFET) and a second NFET, and the protection element includes a p-type FET (PFET).

Example 21 includes the adaptive bypass circuit of Example 20, wherein the drain of the first NFET is coupled to the source of the protection element, the source of the first NFET is coupled to the source of the second NFET, the drain of the second NFET is coupled to the gate of the protection element, and the gates of the first and second NFETs are configured to receive an input signal of the floating level translator.

Example 22 includes the adaptive bypass circuit of Example 21, wherein the drain of a third NFET is coupled to the source of an additional protection element of the floating level translator, the source of the third NFET is coupled to the source of a fourth NFET, the drain of the fourth NFET is coupled to the gate of the additional protection element, and the gates of the third and fourth NFETs are configured to receive an inverted version of the input signal of the floating level translator.

Example 23 is an integrated circuit further comprising the adaptive bypass circuit of Example 18.

Example 24 includes the integrated circuit of Example 23, the integrated circuit further comprising a power converter driver that includes the adaptive bypass circuit.

Example 25 includes the integrated circuit of Example 24, the power converter driver being a high-side low-side driver, and the adaptive bypass circuit is part of a high-side driver circuit of the high-side low-side driver.

Example 26 is a system further comprising the integrated circuit of any one of Examples 23 through 25.

Example 27 includes the system of Example 27, the system being a power converter.

Example 28 includes the system of Example 27, the system being a power supply.

Example 29 includes the system of Example 27, the system being an amplifier.

Example 30 is a voltage level translator circuit. The voltage level translator circuit a first n-type field effect transistor (NFET) and a second NFET, each having a respective source coupled to a ground terminal, the gate of the first NFET configured to receive a pulse width modulated (PWM) input signal, and the gate of the second NFET configured to receive an inverted version of the PWM input signal. The voltage level translator circuit further includes a first p-type field effect transistor (PFET) and a second PFET, each having a respective gate coupled to a floating (e.g., high-voltage) supply reference terminal, the drain of the first PFET coupled to the drain of the first NFET, the drain of the second PFET coupled to the drain of the second NFET, the source of the first PFET coupled to a first output terminal, and the source of the second PFET coupled to a second output terminal. The voltage level translator circuit further includes a third PFET and a fourth PFET, each having a respective source coupled to a floating (e.g., high-voltage) supply power terminal, the drain of the third PFET coupled to the first output terminal, the drain of the fourth PFET coupled to the second output terminal, the gate of the third PFET coupled to the second output terminal, and the gate of the fourth PFET coupled to the first output terminal. The voltage level translator circuit further includes a first bypass circuit coupled from the first output terminal to the gate of the first PFET, and a second bypass circuit coupled from the second output terminal to the gate of the second PFET.

Example 31 includes the voltage level translator circuit of Example 30, wherein the floating supply power terminal is a first supply power terminal, and further includes an inverter configured to generate the inverted version of the PWM input signal, the inverter coupled to a second (e.g., low-voltage) supply power terminal.

Example 32 includes the voltage level translator circuit of Example 30 or 31, wherein the drain of the third PFET is coupled to the first output terminal by a first resistor, and the drain of the fourth PFET is coupled to the second output terminal by a second resistor.

Example 33 includes the voltage level translator circuit of any one of Examples 30 through 32, wherein the first and second NFETs are each a high-voltage NFET, and the first and second PFETs are each a high-voltage PFET.

Example 34 includes the voltage level translator circuit of any one of Examples 30 through 33, and further includes a differential output latch circuit having a first input coupled to the first output terminal, a second input coupled to the second output terminal, a first latched output, and a second latched output.

Example 35 includes the voltage level translator circuit of Example 34, and further includes a logic latch circuit having a first input coupled to the first latch output of the differential output latch, a second input coupled to the second latch output of the differential output latch, and a third latched output.

Example 36 includes the voltage level translator circuit of Example 35, and further includes a buffer or driver circuit configured to receive the third latched output and provide a PWM output signal.

Example 37 includes the voltage level translator circuit of any one of Examples 30 through 36, wherein the first bypass circuit includes a third NFET and a fourth NFET, the drain of the third NFET coupled to the first output terminal, the source of the third NFET coupled to the source of the fourth NFET, the drain of the fourth NFET coupled to the gate of the first PFET, and the gates of the third and fourth NFETs configured to receive the PWM input signal. Also, the second bypass circuit includes a fifth NFET and a sixth NFET, the drain of the fifth NFET coupled to the second output terminal, the source of the fifth NFET coupled to the source of the sixth NFET, the drain of the sixth NFET coupled to the gate of the second PFET, and the gates of the fifth and sixth NFETs configured to receive the inverted version of the PWM input signal.

Example 38 includes the voltage level translator circuit of Example 37, wherein each of the third, fourth, fifth, and sixth NFETs is a high-voltage NFET.

Example 39 is an integrated circuit further comprising the voltage level translator circuit of any one of Examples 30 through 38.

Example 40 includes the integrated circuit of Example 39, the integrated circuit further comprising a power converter driver that includes the voltage level translator circuit.

Example 41 includes the integrated circuit of Example 40, the power converter driver being a high-side low-side driver, and the adaptive bypass circuit is part of a high-side driver circuit of the high-side low-side driver.

Example 42 is a system further comprising the integrated circuit of any of Examples 39 through 41.

Example 43 includes the system of Example 42, the system being a power converter.

Example 44 includes the system of Example 42, the system being a power supply.

Example 45 includes the system of Example 42, the system being an amplifier.

Modifications are possible in the described embodiments, and other embodiments are possible, within the scope of the claims.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over any number of substrates, such as a silicon substrate (Si), a silicon carbide substrate (SiC), a gallium nitride substrate (GaN) or a gallium arsenide substrate (GaAs).

References herein to a field effect transistor (FET) being "ON" means that the conduction channel of the FET is present and drain current may flow through the FET. References herein to a FET being "OFF" means that the conduction channel is not present and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

What is claimed is:

1. An adaptive bypass circuit for a floating level translator, wherein the floating level translator is configured to translate voltage levels from a first voltage domain to a second voltage domain, the adaptive bypass circuit comprising:
   a switching circuit coupled across a protection element of the floating level translator; and
   a comparator circuit configured to activate the switching circuit to bypass the protection element responsive to a reference rail of the second voltage domain being less than a threshold, and to deactivate the switching circuit to not bypass the protection element responsive to the reference rail of the second voltage domain not being less than the threshold.

2. The adaptive bypass circuit of claim 1, wherein the switching circuit and the comparator circuit are implemented with a pair of field effect transistors (FETs) arranged in a back-to-back configuration.

3. The adaptive bypass circuit of claim 2, wherein the pair of FETs includes a first n-type FET (NFET) and a second NFET, and the protection element includes a p-type FET (PFET).

4. The adaptive bypass circuit of claim 3, wherein a drain of the first NFET is coupled to a source of the protection element, a source of the first NFET is coupled to a source of the second NFET, the drain of the second NFET is coupled to a gate of the protection element, and gates of the first and second NFETs are configured to receive an input signal of the floating level translator.

5. The adaptive bypass circuit of claim 4, further comprising a second switching circuit across a second protection element, and a second comparator circuit configured to activate the second switching circuit to bypass the second protection element responsive to a reference rail of the second voltage domain being greater than a threshold, and to deactivate the switching circuit to not bypass the protection element responsive to the reference rail of the second voltage domain not being greater than the threshold.

6. The adaptive bypass circuit of claim 5, wherein the second switching circuit and the second comparator circuit are implemented with a third NFET and a fourth NFET arranged in a back-to-back configuration, and the second protection element includes a second PFET.

7. The adaptive bypass circuit of claim 6, wherein the drain of the third NFET is coupled to the source of the second protection element, the source of the third NFET is coupled to the source of the fourth NFET, the drain of the fourth NFET is coupled to the gate of the second protection element, and gates of the third and fourth NFETs are configured to receive an inverted version of the input signal of the floating level translator.

\* \* \* \* \*